(12) United States Patent
Huang et al.

(10) Patent No.: US 9,590,101 B2
(45) Date of Patent: Mar. 7, 2017

(54) FINFET WITH MULTIPLE DISLOCATION PLANES AND METHOD FOR FORMING THE SAME

(71) Applicant: Taiwan Semiconductor Manufacturing Company, Ltd., Hsin-Chu (TW)

(72) Inventors: Chih-Hsiang Huang, Zhubei (TW); Da-Wen Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/161,723

(22) Filed: May 23, 2016

(65) Prior Publication Data

US 2016/0268429 A1 Sep. 15, 2016

Related U.S. Application Data

(62) Division of application No. 14/585,110, filed on Dec. 29, 2014, now Pat. No. 9,362,278.

(51) Int. Cl.
| | | |
|---|---|---|
| *H01L 21/00* | (2006.01) |
| *H01L 29/78* | (2006.01) |
| *H01L 27/088* | (2006.01) |
| *H01L 29/06* | (2006.01) |
| *H01L 21/8234* | (2006.01) |
| *H01L 21/324* | (2006.01) |
| *H01L 21/265* | (2006.01) |
| *H01L 21/762* | (2006.01) |
| *H01L 29/66* | (2006.01) |
| *H01L 21/84* | (2006.01) |
| *H01L 27/12* | (2006.01) |

(52) U.S. Cl.
CPC .... *H01L 29/7847* (2013.01); *H01L 21/26506* (2013.01); *H01L 21/324* (2013.01); *H01L 21/76224* (2013.01); *H01L 21/823418* (2013.01); *H01L 21/823431* (2013.01); *H01L 21/823481* (2013.01); *H01L 21/845* (2013.01); *H01L 27/0886* (2013.01); *H01L 27/1211* (2013.01); *H01L 29/0653* (2013.01); *H01L 29/66545* (2013.01); *H01L 29/66636* (2013.01); *H01L 29/66795* (2013.01); *H01L 29/785* (2013.01); *H01L 29/7848* (2013.01)

(58) Field of Classification Search
None
See application file for complete search history.

(56) References Cited

U.S. PATENT DOCUMENTS

2003/0219954 A1 11/2003 Baba
2013/0099294 A1 4/2013 Lu et al.

*Primary Examiner* — Reema Patel
(74) *Attorney, Agent, or Firm* — Slater Matsil, LLP (57) ABSTRACT

A method comprises forming a first fin and a second fin over a substrate, wherein the first fin and the second fin are separated by a trench, applying a first pre-amorphous implantation (PAI) process to the substrate and forming a first PAI region underlying the trench as a result of the first PAI process, depositing a first tensile film layer on sidewalls and a bottom of the trench, converting the first PAI region into a first dislocation plane underlying the trench using a first anneal process and forming an isolation region over the first dislocation plane.

20 Claims, 12 Drawing Sheets

FINFET WITH MULTIPLE DISLOCATION PLANES AND METHOD FOR FORMING THE SAME

This application is a divisional of U.S. patent application Ser. No. 14/585,110, entitled "FinFET with Multiple Dislocation Planes and Method for Forming the Same," filed on Dec. 29, 2014, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to more leakage current. As the demand for even smaller electronic devices has grown recently, there has grown a need for reducing leakage current of semiconductor devices.

In a complementary metal oxide semiconductor (CMOS) field effect transistor (FET), active regions include a drain, a source, a channel region connected between the drain and the source, and a gate on top of the channel to control the on and off state of the channel region. When the gate voltage is more than a threshold voltage, a conductive channel is established between the drain and the source. As a result, electrons or holes are allowed to move between the drain and source. On the other hand, when the gate voltage is less than the threshold voltage, ideally, the channel is cut off and there are no electrons or holes flowing between the drain and the source. However, as semiconductor devices keep shrinking, due to the short channel leakage effect, the gate cannot fully control the channel region, especially the portion of the channel region which is far away from the gate. As a consequence, after semiconductor devices are scaled into deep sub-30 nanometer dimensions, the corresponding short gate length of conventional planar transistors may lead to the inability of the gate to substantially turn off the channel region.

As semiconductor technologies evolve, fin field effect transistors (FinFETs) have emerged as an effective alternative to further reduce leakage current in semiconductor devices. In a FinFET, an active region including the drain, the channel region and the source protrudes up from the surface of the semiconductor substrate upon which the FinFET is located. The active region of the FinFET, like a fin, is rectangular in shape from a cross sectional view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The formation of fins of a FinFET may include recessing a substrate to form recesses, filling the recesses with a dielectric material, performing a chemical mechanical polish process to remove excess portions of the dielectric material above the fins, and recessing a top layer of the dielectric material, so that the remaining portions of the dielectric material in the recesses form shallow trench isolation (STI) regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
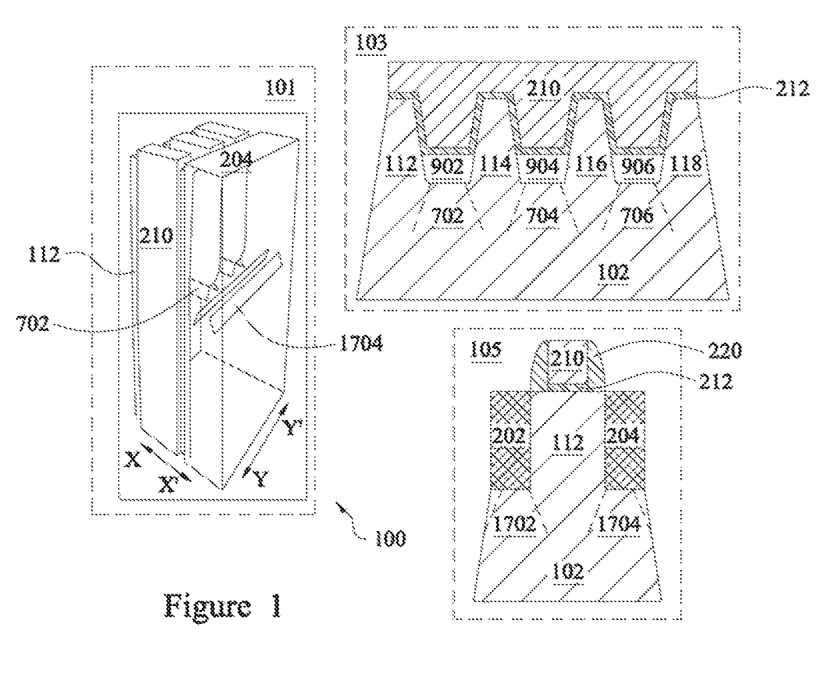
FIG. 1 illustrates a semiconductor device having multiple dislocation planes in accordance with various embodiments of the present disclosure.

FIG. 1 illustrates a semiconductor device having multiple dislocation planes in accordance with various embodiments of the present disclosure. In some embodiments, the semiconductor device 100 is an n-type fin field effect transistor (FinFET). A dashed rectangle 101 shows a three-dimensional view of the semiconductor device 100. A dashed rectangle 103 shows a first cross sectional view of the semiconductor device 100. A dashed rectangle 105 shows a second cross sectional view of the semiconductor device 100. In some embodiments, the first cross sectional view is taken along line Y-Y'. The second cross sectional view is taken along line X-X'. Throughout the description, the first cross sectional view is alternatively referred to as the first cross sectional view 103. The second cross sectional view is alternatively referred to as the second cross sectional view 105.

As shown in the three-dimensional view of FIG. 1, line X-X' is along a longitudinal axis of the fins and in a direction of, for example, a current, which flows between a first drain/source region 202 and a second drain/source region 204. Line Y-Y' is perpendicular to line X-X' and is across channel regions, a gate dielectric layer 212 and a gate electrode layer 210 of the semiconductor device 100.

As shown in the first cross sectional view 103, the semiconductor device 100 may comprise a plurality of semiconductor fins on a substrate 102. A gate structure wraps the semiconductor fins around three sides like an upside-down U. The gate structure may comprise the gate electrode layer 210 and the gate dielectric layer 212 between the gate electrode layer 210 and the semiconductor fins 112, 114, 116 and 118.

As shown in the second cross sectional view 105, the semiconductor device 100 may comprise the first drain/source region 202, the second drain/source region 204 and a channel region coupled between the first drain/source region 202 and the second drain/source region 204. It should be noted that the channel region is wrapped by the gate structure.

As shown in FIG. 1, there may be two groups of dislocation planes. A first group of dislocation planes include dislocation planes 702, 704 and 706. As shown in the first cross sectional view 103, the dislocation planes 702, 704 and 706 are underneath their respective isolation regions 902, 904 and 906. In some embodiments, the dislocation planes 702, 704 and 706 extend in a first direction, which is in parallel with the channel regions of the semiconductor device 100.

A second group of dislocation planes include dislocation planes 1702 and 1704. As shown in the second cross sectional view 105, the dislocation planes 1702 and 1704 are underneath their respective drain/source regions 202 and 204. The dislocation planes 1702 and 1704 extend in a second direction. In some embodiments, the first direction is orthogonal to the second direction. Both the first group of dislocation planes (e.g., dislocation plane 702) and the second group of dislocation planes (e.g., dislocation plane 1702) are employed to improve the performance (e.g., mobility of electrons) of the semiconductor device 100. The detailed processes for forming the dislocation planes shown in FIG. 1 will be described below with respect to FIGS. 3-19.

The gate dielectric layer 212 may be formed of oxide materials and formed by suitable oxidation processes such as wet or dry thermal oxidation, sputtering or by chemical vapor deposition (CVD) techniques using tetra-ethyl-orthosilicate (TEOS) and oxygen as a precursor. In addition, the gate dielectric layer 212 may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof and/or the like.

The gate electrode layer 210 may comprise a conductive material selected from a group comprising of polycrystalline-silicon, poly-crystalline silicon-germanium, metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

The gate electrode layer 210 may formed by suitable fabrication processes such as CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer deposition (ALD) and/or the like.

The spacers 220 may comprise suitable dielectric materials such as silicon nitride, oxynitride, silicon carbide, oxide and/or the like. The spacers 220 may be formed by suitable deposition techniques such as ALD, LPCVD and/or the like. The spacers 220 may be patterned by suitable etching processes such as an anisotropic etching process and the like, thereby forming the spacers 220 as shown in FIG. 1.

Figure 2:
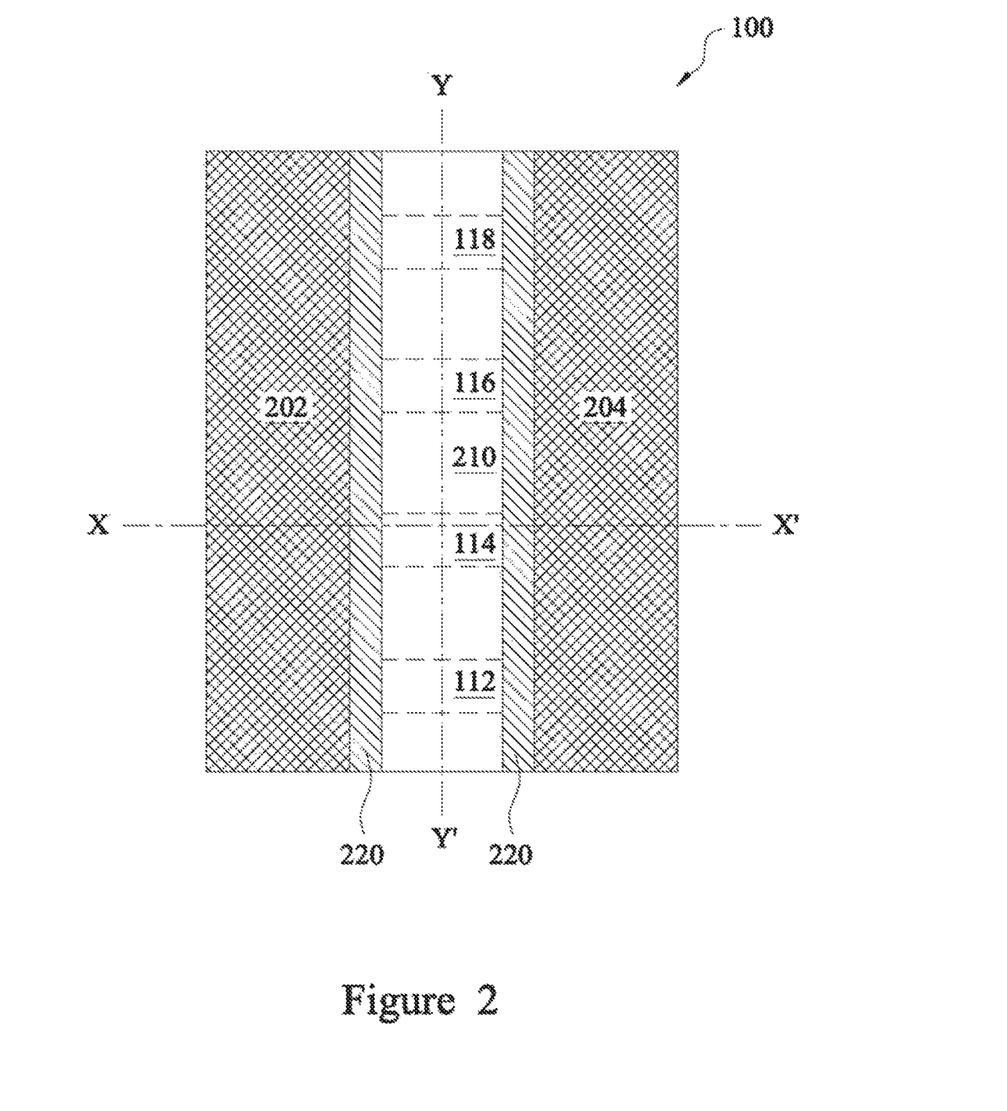
FIG. 2 illustrates a top view of the semiconductor device shown in FIG. 1 in accordance with various embodiments of the present disclosure.

FIG. 2 illustrates a top view of the semiconductor device shown in FIG. 1 in accordance with various embodiments of the present disclosure. As shown in FIG. 2, the first drain/source region 202 and the second drain/source region 204 are disposed in opposite sides of the fins 112, 114, 116 and 118 with respect to the gate electrode layer 210. The gate electrode layer 210 is formed on the top surfaces of the fins 112, 114, 116 and 118. In addition, the gate electrode layer 210 is formed along the sidewalls of the fins 112, 114, 116 and 118. The spacers 220 are disposed in opposite sides of the gate electrode layer 210.

FIGS. 3-19 are cross-sectional views of intermediate stages in the manufacturing of the semiconductor device shown in FIGS. 1-2 in accordance with various embodiments of the present disclosure. In FIGS. 3-12, the cross sectional views are taken along line Y-Y' shown in FIGS. 1-2. In FIGS. 13-19, the cross sectional views are taken along line X-X' shown in FIGS. 1-2.

Figure 3:
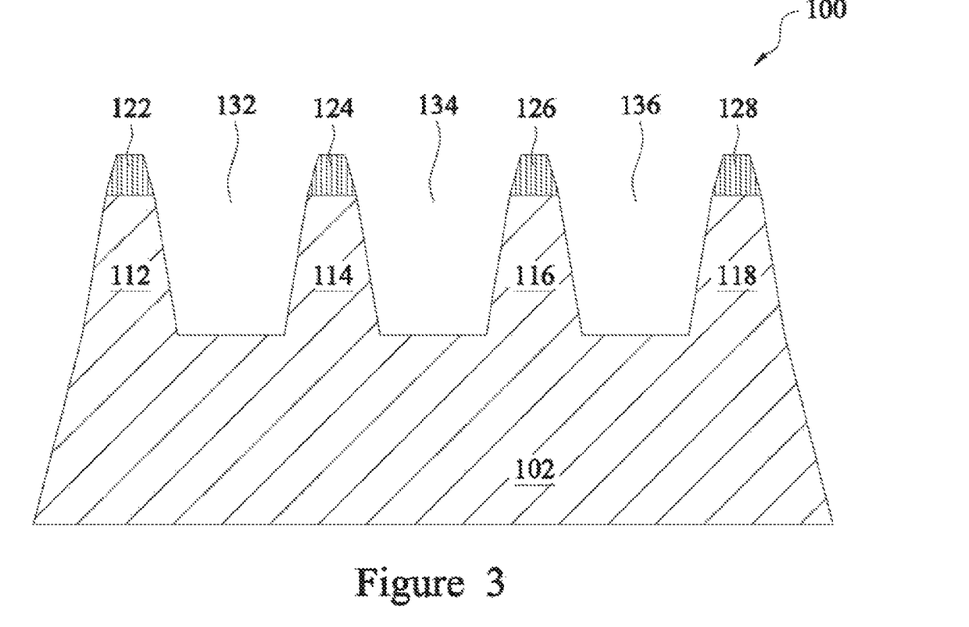
FIG. 3 illustrates a cross sectional view of a semiconductor device including four fins in accordance with various embodiments of the present disclosure.

FIG. 3 illustrates a cross sectional view of a semiconductor device including four fins in accordance with various embodiments of the present disclosure. The semiconductor device 100 includes four semiconductor fins 112, 114, 116 and 118. As shown in FIG. 3, the semiconductor fins 112, 114, 116 and 118 are formed over the substrate 102. The semiconductor fins 112 and 114 are separated by a first trench 132 Likewise, the semiconductor fins 114 and 116 are separated by a second trench 134, and the semiconductor fins 116 and 118 are separated by a third trench 136.

In some embodiments, the trenches 132, 134 and 136 may be strips (viewed from a top view of the semiconductor device 100) parallel to each other, and closely spaced with respect to each other. In alternative embodiments, the trenches 132, 134 and 136 may be portions of a continuous trench.

In some embodiments, the semiconductor fins 112, 114, 116 and 118 may form a single n-type FinFET. In alternative embodiments, the semiconductor fins 112, 114, 116 and 118 may form four separate n-type FinFETs.

It should be noted that while FIG. 3 shows the semiconductor device 100 includes four fins (e.g., fins 112, 114, 116 and 118), this is merely an example. One skilled in the art will recognize there may be many modifications, alternatives and variations. For example, the semiconductor device 100 may accommodate any number of fins depending on different applications and design needs.

The substrate 102 may be formed of silicon. Other commonly used materials, such as carbon, germanium, gallium, arsenic, nitrogen, indium, and/or phosphorus, and the like, may also be included in the substrate 102. The substrate 102 may be a bulk substrate or a semiconductor-on-insulator (SOI) substrate.

As shown in FIG. 3, there may be four mask layers 122, 124, 126 and 128 formed on their respective semiconductor fins 112, 114, 116 and 118. In some embodiments, the mask layers 122, 124, 126 and 128 are formed of silicon nitride. The mask layers 122, 124, 126 and 128 may be formed by suitable semiconductor fabrication techniques such as LPCVD, PECVD and/or the like. The mask layers 122, 124, 126 and 128 may be used as a hard mask during subsequent photolithography processes.

Figure 4:
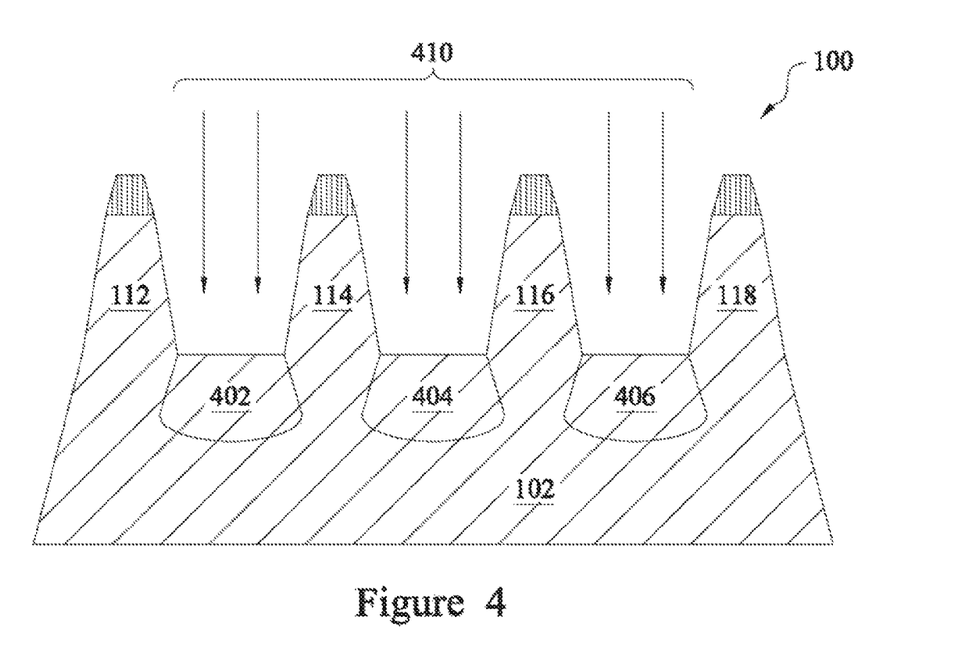
FIG. 4 illustrates a cross sectional view of the semiconductor device shown in FIG. 3 after a first pre-amorphous implantation (PAI) process is applied to the semiconductor device in accordance with various embodiments of the present disclosure.

FIG. 4 illustrates a cross sectional view of the semiconductor device shown in FIG. 3 after a first pre-amorphous implantation (PAI) process is applied to the semiconductor device in accordance with various embodiments of the present disclosure. As indicated by arrows 410, suitable semiconductor materials such as germanium, silicon and/or the like are implanted to convert the crystal structure of the substrate 102 into a plurality of structurally amorphous structures. Throughout the description, the region having an amorphous state is alternatively referred to as a PAI region.

In some embodiments, the energy of the first PAI process is in a range from about 15 KeV to about 25 KeV. The implantation dosage of the first PAI process is in a range from about $1E21/cm^2$ to about $4E21/cm^2$. The first PAI process may be performed at a temperature in a range from about −60 degrees to about −100 degrees.

As shown in FIG. 4, after the first PAI process finishes, there may be three PAI regions, namely a first PAI region 402, a second PAI region 404 and a third PAI region 406. The first PAI region 402 is between the semiconductor fins 112 and 114. The second PAI region 404 is between the semiconductor fins 114 and 116. The third PAI region 406 is between the semiconductor fins 116 and 118.

Figure 5:
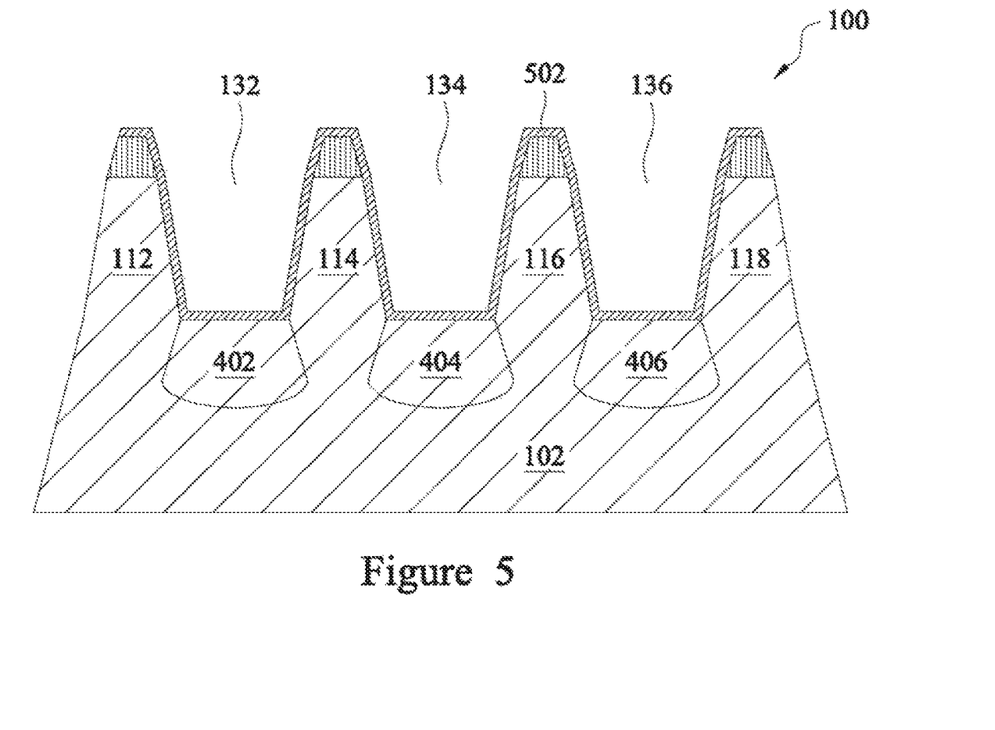
FIG. 5 illustrates a cross sectional view of the semiconductor device shown in FIG. 4 after a buffer oxide layer is formed over the semiconductor device in accordance with various embodiments of the present disclosure.

FIG. 5 illustrates a cross sectional view of the semiconductor device shown in FIG. 4 after a buffer oxide layer is formed over the semiconductor device in accordance with various embodiments of the present disclosure. The buffer oxide layer 502 may be formed of suitable dielectric materials such as silicon oxide and/or the like. The buffer oxide layer 502 may be deposited or thermally grown according to acceptable semiconductor fabrication techniques such as CVD and/or the like.

Figure 6:
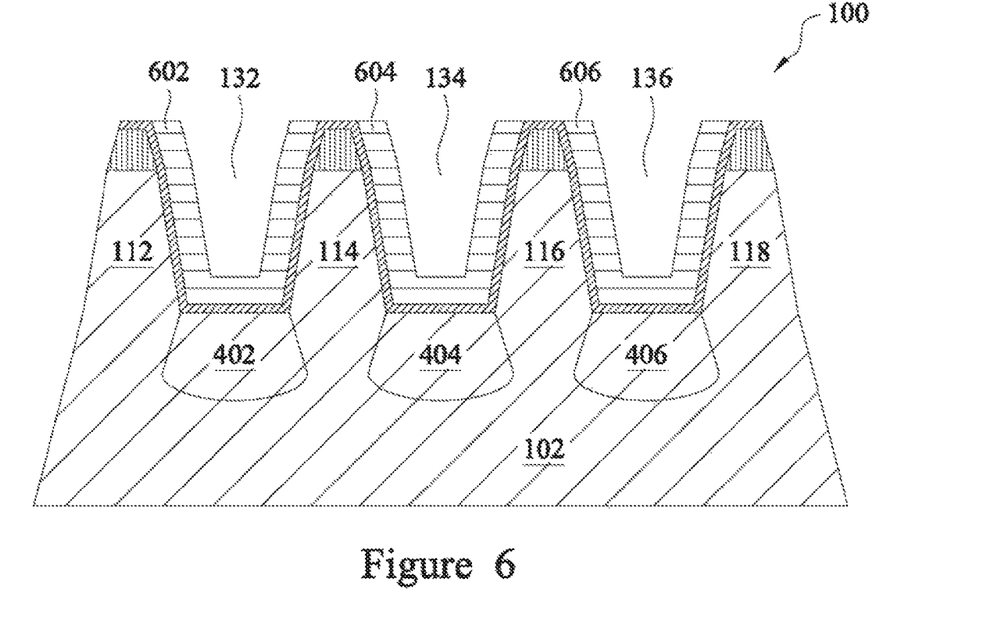
FIG. 6 illustrates a cross sectional view of the semiconductor device shown in FIG. 5 after a tensile film layer is formed over the buffer oxide layer in accordance with various embodiments of the present disclosure.

FIG. 6 illustrates a cross sectional view of the semiconductor device shown in FIG. 5 after a tensile film layer is formed over the buffer oxide layer in accordance with various embodiments of the present disclosure. The tensile film layer is formed along the sidewalls and bottom of each trench (e.g., trench 132) through suitable semiconductor deposition processes. As shown in FIG. 6, the tensile film layer includes three portions. A first portion 602 is formed in the first trench 132. Likewise, a second portion 604 and a third portion 606 are formed in the second trench 134 and the third trench 136 respectively.

In some embodiments, the tensile film layer is formed of suitable semiconductor materials having intrinsic tensile stresses. For example, the tensile film layer may be formed of nitride materials such as silicon nitride, titanium nitride and/or the like. Alternatively, the tensile film layer may be formed of suitable oxide materials.

It should be noted while FIG. 6 illustrates a single tensile film layer (e.g., the first portion 602), one of ordinary skill in the art would recognize many variations, alternatives, and modifications. For example, a multi-layer tensile film layer may also be used.

Figure 7:
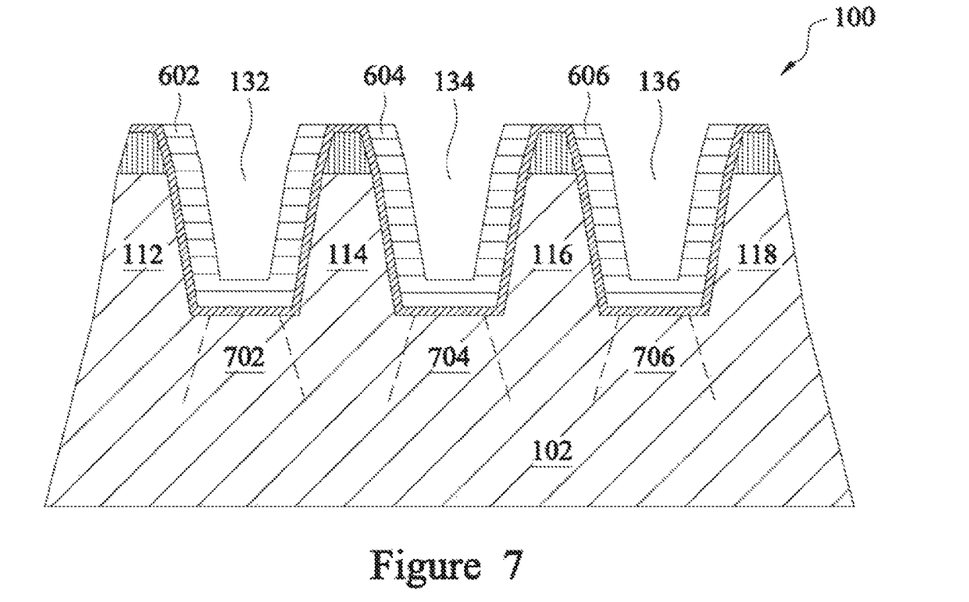
FIG. 7 illustrates a cross sectional view of the semiconductor device shown in FIG. 6 after a first anneal process is applied to the semiconductor device in accordance with various embodiments of the present disclosure.

FIG. 7 illustrates a cross sectional view of the semiconductor device shown in FIG. 6 after a first anneal process is applied to the semiconductor device in accordance with various embodiments of the present disclosure. The first anneal process is employed to form dislocation planes 702, 704 and 706. During the anneal process, tensile stresses from the substrate 102 and the tensile film (e.g., 602, 604 and 606) are applied to the channel regions so as to improve the electron mobility. As a result, the performance of the n-type FinFET formed by the fins 112, 114, 116 and 118 shown FIG. 7 is improved.

It should be noted that the dislocation planes 702, 704 and 706 shown in FIG. 7 are from a cross sectional view. In a top view, the dislocation planes 702, 704 and 706 extend in X-X' direction shown in FIGS. 1-2.

In some embodiments, the first anneal process is implemented as suitable thermal processes such as a rapid thermal anneal process and/or the like. The temperature of the first anneal process is in a range from about 500 degrees to about 700 degrees. The duration of the first anneal process is in a range from about one minute to about six minutes.

In a conventional stress memorization technique (SMT) based semiconductor device, the dislocation planes are formed in a direction in parallel with line Y-Y' shown in FIGS. 1-2. One advantageous feature of having the dislocation planes 702, 704 and 706 shown in FIG. 7 is the semiconductor device 100 comprises both the dislocation planes (e.g., dislocation plane 1704 shown in FIG. 1) formed in a direction in parallel with line Y-Y' and the dislocation planes (e.g., dislocation plane 702) formed in a direction in parallel with line X-X'. The dislocation planes 702, 704 and 706 may induce additional tensile stresses in the channel region for further improving the electron mobility of the semiconductor device 100. In some embodiments, the dislocation planes 702, 704 and 706 may boost the electron mobility of the semiconductor device 100 by about 5%.

Figure 8:
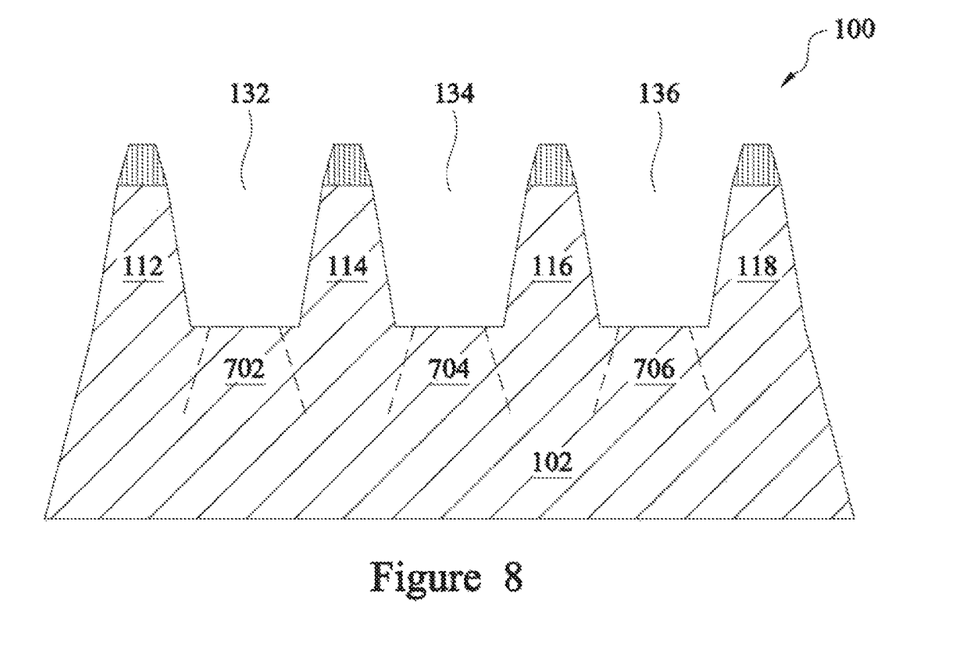
FIG. 8 illustrates a cross sectional view of a semiconductor device shown in FIG. 7 after a tensile film removal process has been applied to the semiconductor device in accordance with various embodiments of the present disclosure.

FIG. 8 illustrates a cross sectional view of a semiconductor device shown in FIG. 7 after a tensile film removal process has been applied to the semiconductor device in accordance with various embodiments of the present disclosure. The buffer oxide layer 502 and the tensile film layer shown in FIG. 7 may be removed by suitable etching processes such as a dry etching process, a wet etching process and any combinations thereof.

Figure 9:
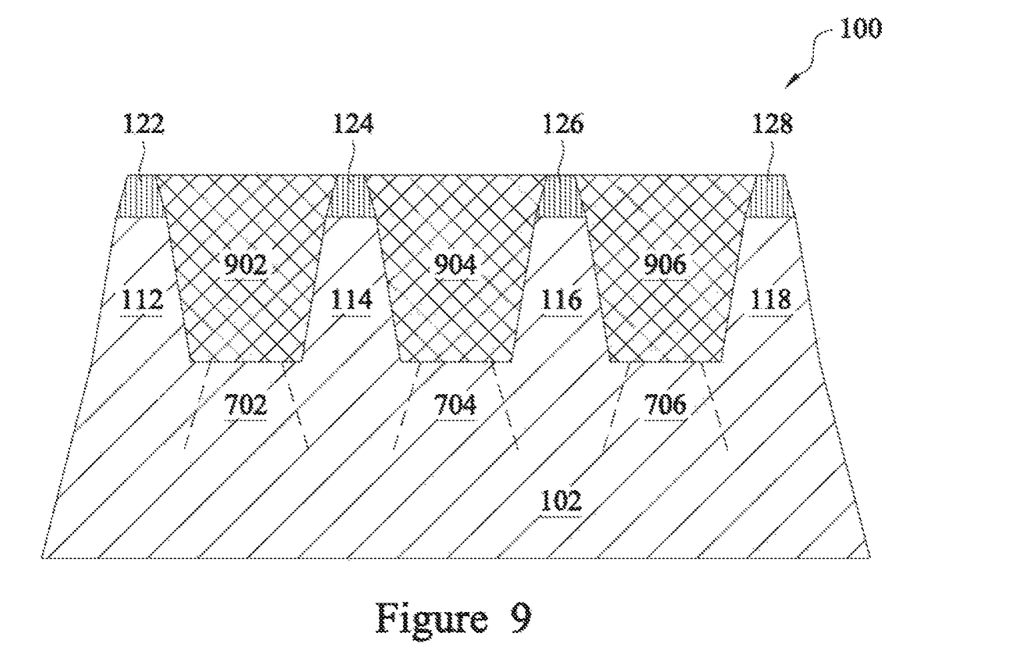
FIG. 9 illustrates a cross sectional view of a semiconductor device shown in FIG. 8 after a plurality of isolation regions have been formed in accordance with various embodiments of the present disclosure.

FIG. 9 illustrates a cross sectional view of a semiconductor device shown in FIG. 8 after a plurality of isolation regions have been formed in accordance with various embodiments of the present disclosure. The isolation regions 902, 904 and 906 may be implemented by a shallow trench isolation (STI) structure. The STI structure (e.g., isolation region 902) may be fabricated by using suitable techniques including photolithography and etching processes. The trenches 132, 134 and 136 are filled with dielectric materials to form the STI structures (e.g., isolation regions 902).

In accordance with an embodiment, the isolation regions (e.g., isolation region 902) may be filled with a dielectric material such as an oxide material, a high-density plasma (HDP) oxide or the like. Alternatively, the dielectric material may be formed of materials selected from the group consisting of silicon oxide, silicon nitride, silicon carbon nitride, silicon oxy-carbon nitride and any combinations thereof.

The dielectric material may be deposited through suitable deposition techniques such as CVD, sub-atmospheric CVD (SACVD), HDPCVD and/or the like A chemical mechanical polishing (CMP) process is then applied to the portion of the dielectric material over the fins. As a result, excess portions of the dielectric material have been removed as shown in FIG. 9. The remaining portions of the dielectric material are the isolation regions 902, 904 and 906. As shown in FIG. 9, the top surfaces of the isolation regions 902, 904 and 906 are level with the top surfaces of the mask layers 122, 124, 126 and 128.

As shown in FIG. 9, the isolation regions 902, 904 and 906 may be portions of a continuous region, which may form an isolation ring in accordance with an embodiment. Alternatively, the isolation regions 902, 904 and 906 may be three separate isolation regions having their sidewalls facing each other.

Figure 10:
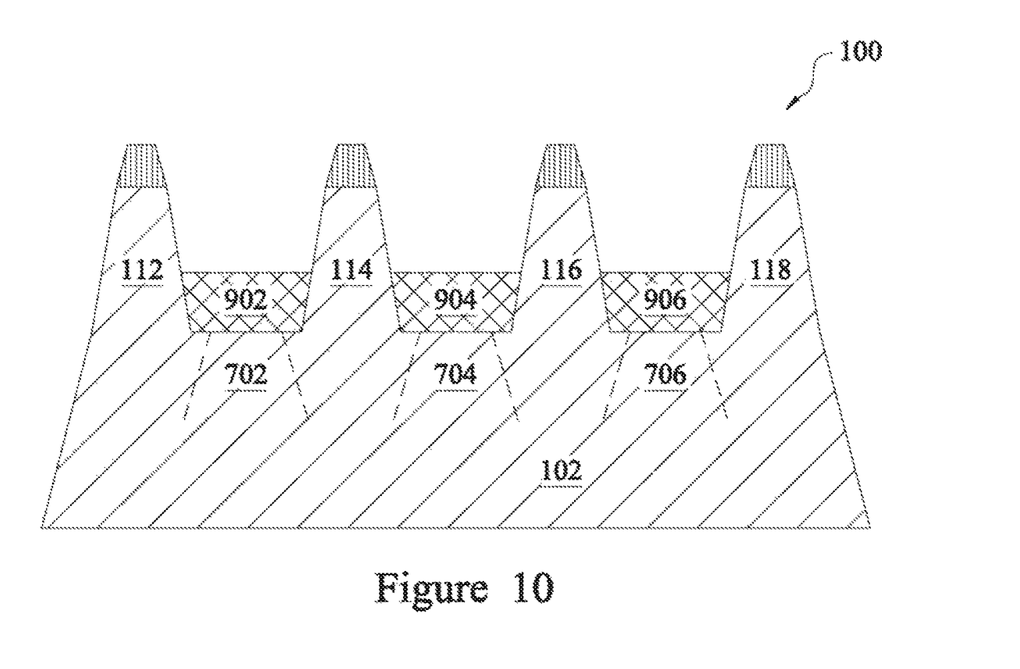
FIG. 10 illustrates a cross sectional view of the semiconductor device shown in FIG. 9 after an etching process has been applied to the semiconductor device in accordance with various embodiments of the present disclosure.

FIG. 10 illustrates a cross sectional view of the semiconductor device shown in FIG. 9 after an etching process has been applied to the semiconductor device in accordance with various embodiments of the present disclosure. The mask layers 122, 124, 126 and 128 shown in FIG. 9 may be removed by suitable etching techniques such as an etching process selective to the material of the mask layers 122, 124, 126 and 128. In some embodiments, the mask layers 122, 124, 126 and 128 are formed of silicon nitride. The mask layers 122, 124, 126 and 128 may be removed using a wet process using hot $H_3PO_4$.

The isolation regions 902, 904 and 906 are recessed such that respective fins 112, 114, 116 and 118 may protrude over the top surfaces of the isolation regions 902, 904 and 906. The isolation regions 902, 904 and 906 may be recessed using a suitable etching process, such as one that is selective to the material of the isolation regions 902, 904 and 906. For example, a chemical oxide removal (COR) using a Tokyo Electron CERTAS, an Applied Material SICONI tool and/or the like may be used. Alternatively, suitable wet etching processes such as dilute hydrofluoric (dHF) acid may be used.

Figure 11:
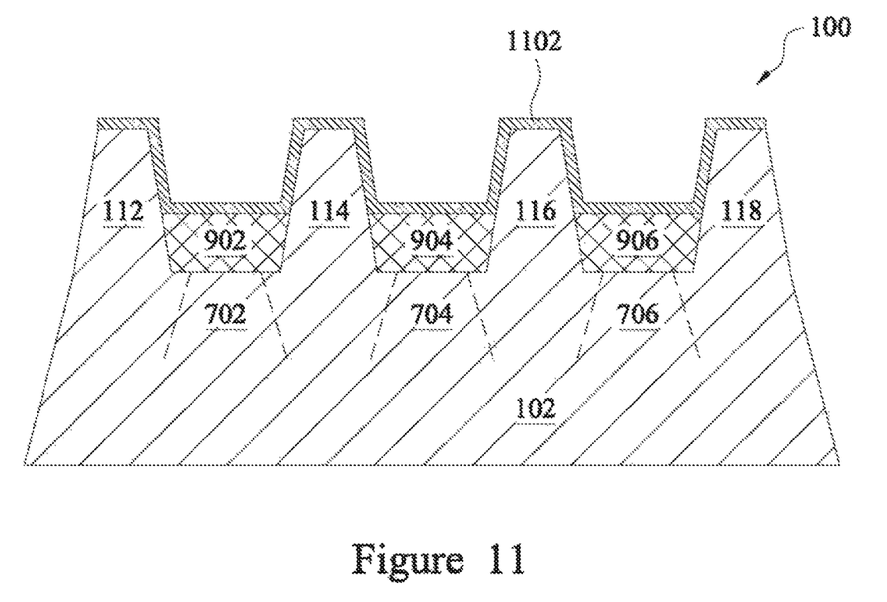
FIG. 11 illustrate a cross sectional view of the semiconductor device shown in FIG. 10 after a dummy gate dielectric layer is formed over the semiconductor device in accordance with various embodiments of the present disclosure.

FIG. 11 illustrate a cross sectional view of the semiconductor device shown in FIG. 10 after a dummy gate dielectric layer is formed over the semiconductor device in accordance with various embodiments of the present disclosure. The dummy gate dielectric layer 1102 is formed on the fins 112, 114, 116 and 118. The dummy gate dielectric layer 1102 may be formed of suitable dielectric materials such as silicon oxide, silicon nitride, a combination thereof and/or the like. The dummy gate dielectric layer 1102 may be deposited or thermally grown according to acceptable techniques.

Figure 12:
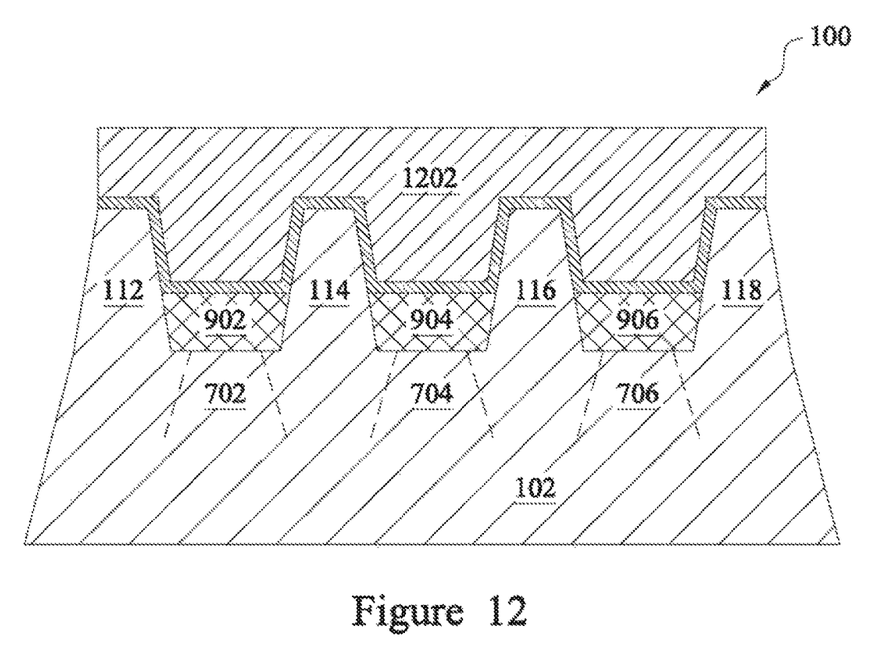
FIG. 12 illustrate a cross sectional view of the semiconductor device shown in FIG. 11 after a dummy gate electrode is formed over the dummy gate dielectric layer in accordance with various embodiments of the present disclosure.

FIG. 12 illustrate a cross sectional view of the semiconductor device shown in FIG. 11 after a dummy gate electrode layer is formed over the dummy gate dielectric layer in accordance with various embodiments of the present disclosure. The dummy gate electrode layer 1202 may be formed of suitable gate electrode materials such as polysilicon. A chemical mechanical polishing process may be applied to the portion of the dummy gate electrode layer 1202. As a result, a flat gate electrode layer is obtained as shown in FIG. 12.

It should be noted that the dummy gate electrode described above is merely an exemplary process and is not meant to limit the current embodiments. Other gate structure formation processes, such as a gate-first formation process, may alternatively be used. In sum, both the gate-last formation process and the gate-first formation process are fully intended to be included within the scope of the embodiments discussed herein.

Figure 13:
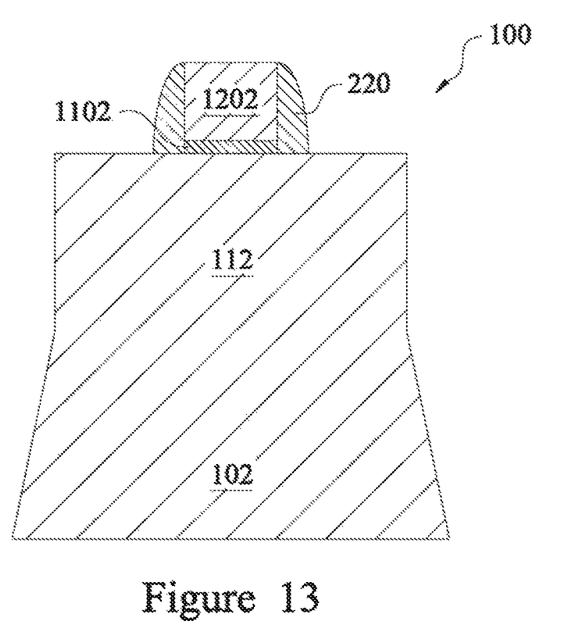
FIG. 13 illustrate another cross sectional view of the semiconductor device shown in FIG. 12 in accordance with various embodiments of the present disclosure.

FIG. 13 illustrate another cross sectional view of the semiconductor device shown in FIG. 12 in accordance with various embodiments of the present disclosure. The cross sectional view shown in FIG. 13 is taken along line X-X' shown in FIGS. 1-2. As shown in FIG. 13, the semiconductor fin 112 is over the substrate 102. The dummy gate dielectric layer 1102 is formed over the semiconductor fin 112. In particular, the dummy gate dielectric layer 1102 occupies the middle portion of the top surface of the semiconductor fin 112. The dummy gate electrode 1202 is formed over the dummy gate dielectric layer 1102. The spacers 220 are formed along the sidewalls of the dummy gate electrode 1202 and the dummy gate dielectric layer 1102.

Figure 14:
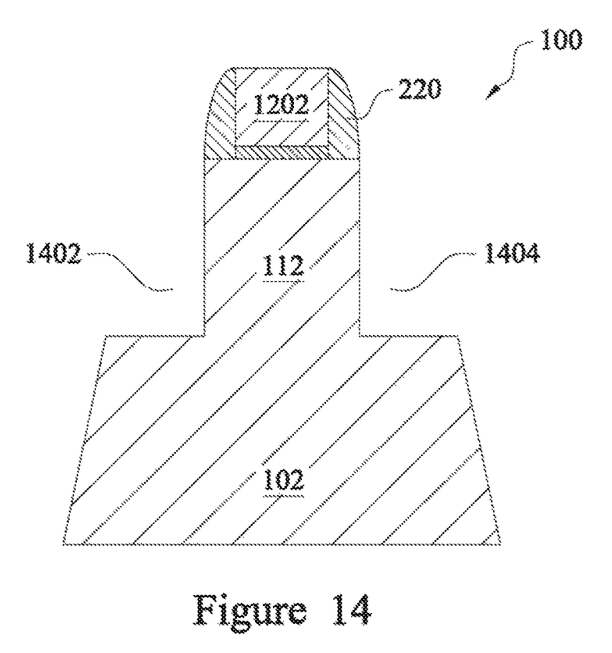
FIG. 14 illustrates a cross sectional view of the semiconductor device shown in FIG. 13 after an etching process is applied to the fins in accordance with various embodiments of the present disclosure.

FIG. 14 illustrates a cross sectional view of the semiconductor device shown in FIG. 13 after an etching process is applied to the fins in accordance with various embodiments of the present disclosure. As shown in FIG. 14, drain/source regions of the fins (e.g., semiconductor fin 112) are etched to form drain/source recesses 1402 and 1404. The drain/source recesses 1402 and 1404 may be formed by using suitable etching processes such as a dry etching, a wet etching, or any combinations thereof.

Figure 15:
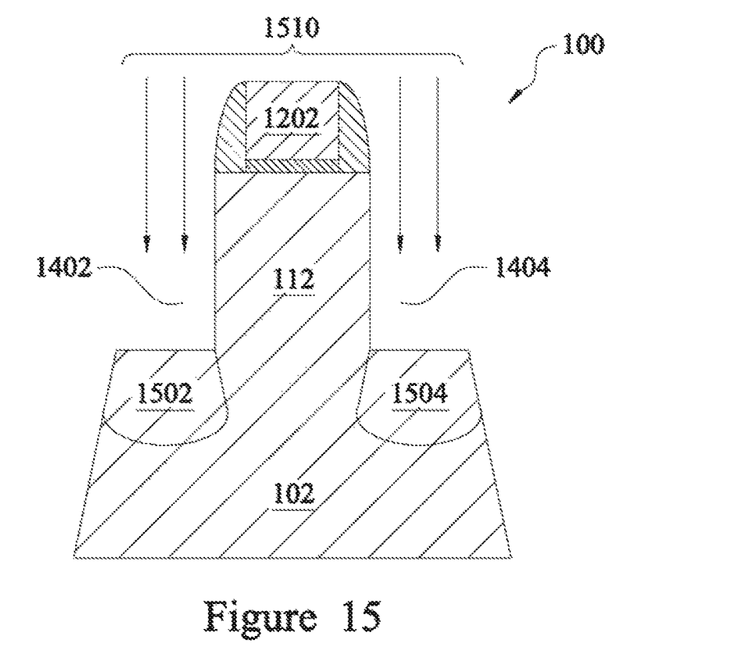
FIG. 15 illustrates a cross sectional view of the semiconductor device shown in FIG. 14 after a second PAI process is applied to the semiconductor device in accordance with various embodiments of the present disclosure.

FIG. 15 illustrates a cross sectional view of the semiconductor device shown in FIG. 14 after a second PAI process is applied to the semiconductor device in accordance with various embodiments of the present disclosure. The second PAI process indicated by arrows 1510 is similar to the first PAI process shown in FIG. 4, and hence is not discussed in detail to avoid repetition. As shown in FIG. 15, after the second PAI process finishes, two PAI regions 1502 and 1504 are formed in the substrate 102.

Figure 16:
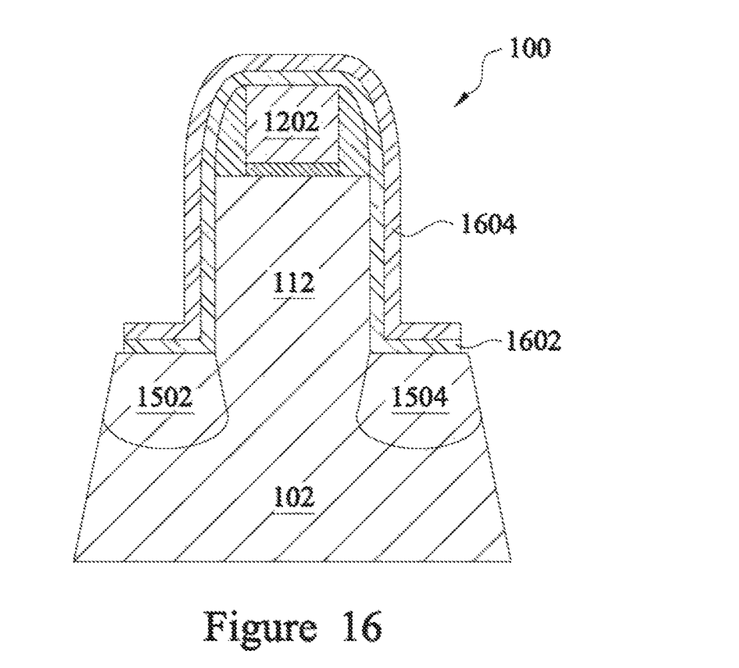
FIG. 16 illustrates a cross sectional view of the semiconductor device shown in FIG. 15 after a buffer oxide layer and a tensile film layer are formed over the semiconductor device in accordance with various embodiments of the present disclosure.

FIG. 16 illustrates a cross sectional view of the semiconductor device shown in FIG. 15 after a buffer oxide layer and a tensile film layer are formed over the semiconductor device in accordance with various embodiments of the present disclosure. The formation process of the buffer oxide layer 1602 shown in FIG. 16 is similar to that of the buffer oxide layer shown in FIG. 5, and hence is not discussed in further detail to avoid repetition. Likewise, the formation process of the tensile film layer 1604 shown in FIG. 16 is similar to that of the tensile film layer shown in FIG. 6, and hence is not discussed in further detail to avoid repetition.

Figure 17:
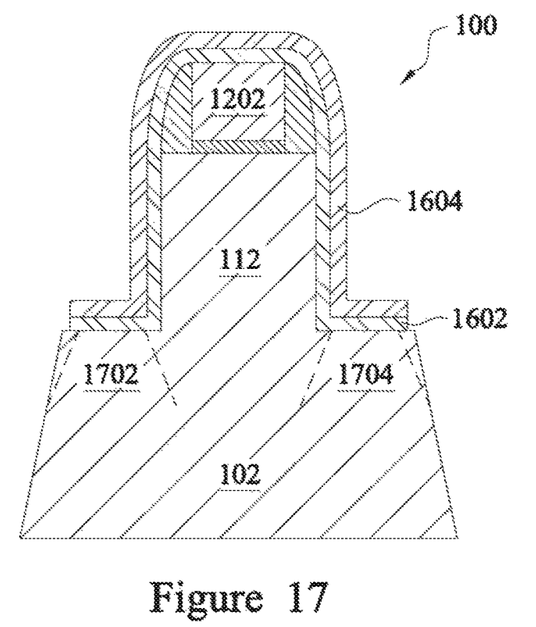
FIG. 17 illustrates a cross sectional view of the semiconductor device shown in FIG. 16 after a second anneal process is applied to the semiconductor device in accordance with various embodiments of the present disclosure.

FIG. 17 illustrates a cross sectional view of the semiconductor device shown in FIG. 16 after a second anneal process is applied to the semiconductor device in accordance with various embodiments of the present disclosure. The second anneal process is employed to convert the PAI regions 1502 and 1504 into their respective dislocation planes 1702 and 1704. The second anneal process in FIG. 17 is similar to the first anneal process shown in FIG. 7, and hence is not discussed in further detail to avoid repetition.

It should be noted that the dislocation planes 1702 and 1704 shown in FIG. 17 are from a cross sectional view. In a top view, the dislocation planes 1702 and 1704 extend in Y-Y' direction shown in FIGS. 1-2.

Figure 18:
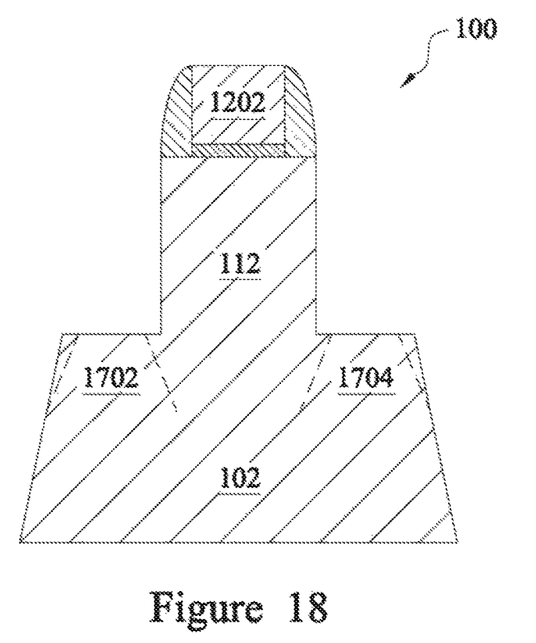
FIG. 18 illustrates a cross sectional view of a semiconductor device shown in FIG. 17 after a tensile film removal process has been applied to the semiconductor device in accordance with various embodiments of the present disclosure.

FIG. 18 illustrates a cross sectional view of a semiconductor device shown in FIG. 17 after a tensile film removal process has been applied to the semiconductor device in accordance with various embodiments of the present disclosure. The buffer oxide layer and the tensile film layer may be removed by suitable etching processes such as a dry etching process, a wet etching process and any combinations thereof.

Figure 19:
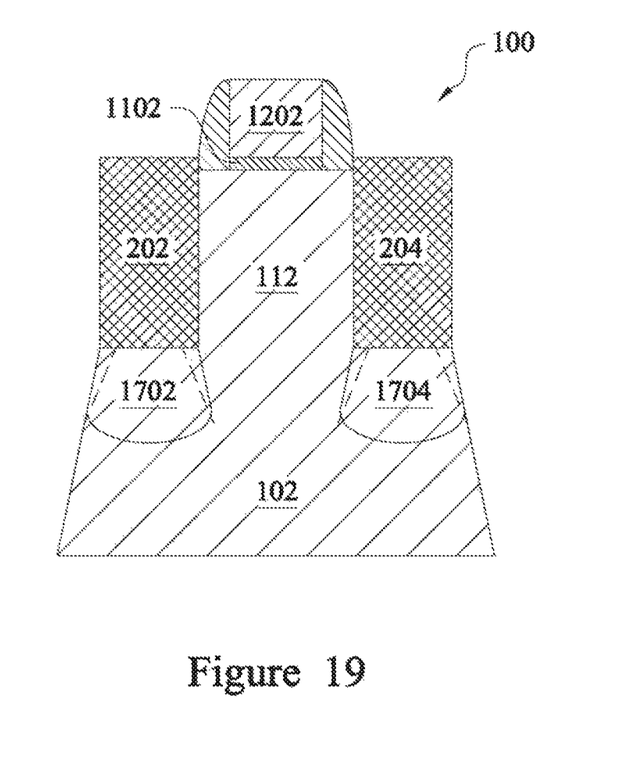
FIG. 19 illustrates a cross sectional view of the semiconductor device shown in FIG. 18 after an epitaxial growth process is applied to the fins in accordance with various embodiments of the present disclosure.

FIG. 19 illustrates a cross sectional view of the semiconductor device shown in FIG. 18 after an epitaxial growth process is applied to the fins in accordance with various embodiments of the present disclosure. In some embodiments, the drain/source regions 202 and 204 may be epitaxially grown in the drain/source recesses 1402 and 1404.

As shown in FIG. 19, the top surfaces of the drain/source regions 202 and 204 may be over the top surface of the semiconductor fin 112.

In some embodiments, a drain/source implantation process may be applied to the semiconductor fins (e.g., semiconductor fin 112). Since the semiconductor device 100 is an n-type FinFET, the drain/source regions 202 and 204 may be formed by implanting appropriate n-type dopants such as phosphorous, arsenic and/or the like. In alternative embodiments, the epitaxial source/drain regions 202 and 204 shown in FIG. 19 may be in situ doped during growth.

The dummy gate electrode layer 1202 shown in FIG. 19 may be removed by suitable etching processes. It should be noted that during the dummy gate removal process, the dummy gate dielectric layer 1102 formed between the dummy gates and the semiconductor fin 112 may be used as an etch stop layer. The dummy gate dielectric layer 1102 may be removed by suitable etching processes such as a dry etching process, a wet etching process and any combinations thereof.

After the dummy gate electrode layer 1202 and the dummy gate dielectric layer 1102 have been removed, the gate electrode layer 210 shown in FIG. 1 may be formed accordingly. The formation process of the gate electrode layer 210 is well known, and hence is not discussed again herein.

Figure 20:
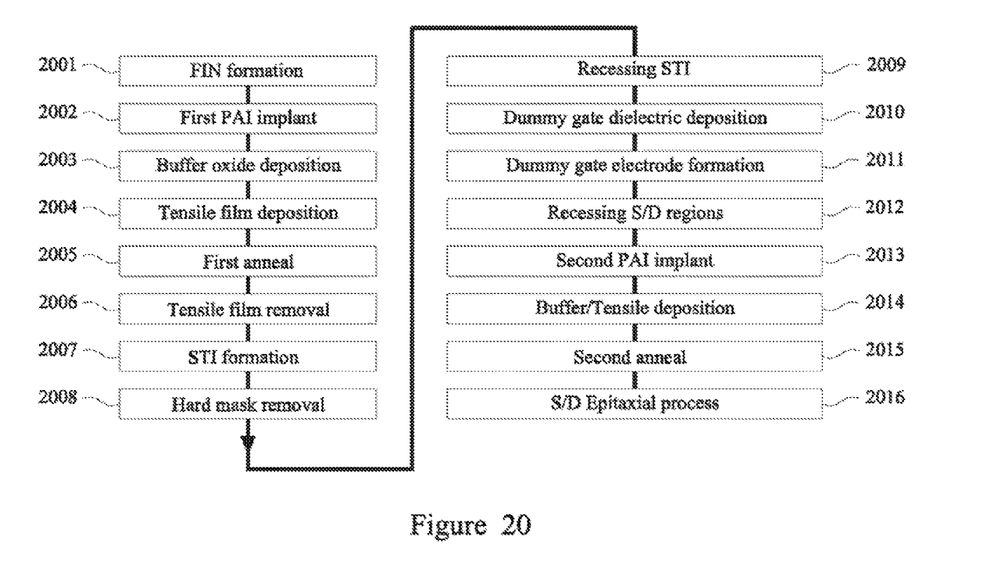
FIG. 20 is a process flow of the fabrication steps shown in FIGS. 3-19 in accordance with various embodiments of the present disclosure.

FIG. 20 is a process flow of the fabrication steps shown in FIGS. 3-19 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 20 may added, removed, replaced, rearranged and repeated.

At step 2001, a plurality of semiconductor fins are formed over a substrate. Two adjacent semiconductor fins are separated by a trench. A mask layer is on a top surface of each semiconductor fin.

At step 2002, a first PAI process is applied to the substrate. As a result of the first PAI process, a plurality of PAI regions may be formed in the substrate. At step 2003, a buffer oxide layer is deposited over the semiconductor fins. The buffer oxide layer is formed on the top surfaces as well as the sidewalls of the semiconductor fins.

At step 2004, a tensile film layer is deposited in the trenches. The tensile film layer is formed on the sidewalls and the bottom of each trench. At step 2005, a first annealing process is employed to convert the PAI regions into their respective dislocation planes. The dislocation planes are in parallel with the longitudinal axis of the semiconductor fins.

At step 2006, a suitable etching process is employed to remove the tensile film and the buffer oxide layer. At step 2007, isolation regions such as STI regions are formed between the adjacent semiconductor fins. The formation of the STI regions is discussed in detail with respect to FIG. 9.

At step 2008, the mask layers formed over the semiconductor fins have been removed through a suitable etching process. At step 2009, the semiconductor fins protrude over the top surfaces of the isolation regions through recessing the isolation regions. The isolation region recess process is illustrated in FIG. 10.

At step 2010, a dummy gate dielectric layer is deposited as shown in FIG. 11. At step 2011, a dummy gate electrode layer is deposited over the dummy gate dielectric layer as shown in FIG. 12.

At step 2012, the drain/source trenches of the semiconductor device are formed through recessing portions of the fins. At step 2013, a second PAI process is applied to the substrate. As a result of the second PAI process, a plurality of PAI regions may be formed in the substrate. In particular, the PAI regions formed by the second PAI process are underneath their respective drain/source trenches.

At step 2014, a buffer oxide layer is deposited in the drain/source trenches. A tensile film layer is deposited over the buffer oxide layer. At step 2015, a second annealing process is employed to convert the PAI regions formed at step 2013 into their respective dislocation planes. The dislocation planes formed at step 2015 are perpendicular to the dislocation planes formed at step 2005. At step 2016, the drain/source regions are formed through suitable processes such as an epitaxial process as shown in FIG. 19.

In accordance with an embodiment, a method comprises forming a first semiconductor fin and a second semiconductor fin over a substrate, wherein the first semiconductor fin and the second semiconductor fin are separated by a first trench, forming a first structurally amorphous region in the substrate and between the first semiconductor fin and the second semiconductor fin, forming a first dislocation plane by applying a first anneal process to the first structurally amorphous region, wherein the first dislocation plane extends in a first direction in parallel with a longitudinal axis of the first semiconductor fin, applying an etching process to the first semiconductor fin to form a first drain/source recess, forming a second structurally amorphous region underlying the first drain/source recess and forming a second dislocation plane by applying a second anneal process to the second structurally amorphous region, wherein the first dislocation plane is orthogonal to the second dislocation plane.

In accordance with an embodiment, a method comprises forming a first fin and a second fin over a substrate, wherein the first fin and the second fin are separated by a trench, applying a first pre-amorphous implantation (PAI) process to the substrate and forming a first PAI region underlying the trench as a result of the first PAI process, depositing a first oxide layer on sidewalls and a bottom of the trench, depositing a first tensile film layer over the first oxide layer, converting the first PAI region into a first dislocation plane underlying the trench using a first anneal process, wherein the first dislocation plane extends in a first direction and forming a second dislocation plane underlying a first drain/source region, wherein the second dislocation plane extends in a second direction orthogonal to the first direction.

In accordance with an embodiment, a method comprises forming a first fin and a second fin over a substrate, wherein the first fin and the second fin are separated by a trench, applying a first pre-amorphous implantation (PAI) process to the substrate and forming a first PAI region underlying the trench as a result of the first PAI process, depositing a first tensile film layer on sidewalls and a bottom of the trench, converting the first PAI region into a first dislocation plane underlying the trench using a first anneal process and forming an isolation region over the first dislocation plane.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first semiconductor fin and a second semiconductor fin over a substrate, wherein the first semiconductor fin and the second semiconductor fin are separated by a first trench;
    forming a first structurally amorphous region in the substrate and between the first semiconductor fin and the second semiconductor fin;
    forming a first dislocation plane by applying a first anneal process to the first structurally amorphous region, wherein the first dislocation plane extends in a first direction in parallel with a longitudinal axis of the first semiconductor fin;
    applying an etching process to the first semiconductor fin to form a first drain/source recess;
    forming a second structurally amorphous region underlying the first drain/source recess; and
    forming a second dislocation plane by applying a second anneal process to the second structurally amorphous region, wherein the first dislocation plane is orthogonal to the second dislocation plane.

2. The method of claim 1, further comprising:
    applying a pre-amorphous implantation process to the substrate to form the first structurally amorphous region.

3. The method of claim 1, further comprising:
    prior to the step of forming the first dislocation plane, depositing a first buffer oxide layer over a bottom and sidewalls of the first trench; and
    depositing a first tensile film layer over the first buffer oxide layer.

4. The method of claim 1, further comprising:
    forming a first drain/source region in the first drain/source recess, wherein the second dislocation plane is underlying the first drain/source region.

5. The method of claim 1, further comprising:
    prior to the step of forming the second dislocation plane, depositing a second buffer oxide layer over a bottom and sidewalls of the first drain/source recess; and
    depositing a second tensile film layer over the second buffer oxide layer.

6. The method of claim 1, further comprising:
    forming an isolation region in the first trench; and
    recessing the isolation region so that the first semiconductor fin and the second semiconductor fin protrude over a top surface of the isolation region.

7. The method of claim 6, wherein:
    the isolation region is a shallow trench isolation region.

8. A method comprising:
    forming a first fin and a second fin over a substrate, wherein the first fin and the second fin are separated by a trench;
    applying a first pre-amorphous implantation (PAI) process to the substrate and forming a first PAI region underlying the trench as a result of the first PAI process;
    depositing a first oxide layer on sidewalls and a bottom of the trench;
    depositing a first tensile film layer over the first oxide layer;
    converting the first PAI region into a first dislocation plane underlying the trench using a first anneal process, wherein the first dislocation plane extends in a first direction; and forming a second dislocation plane underlying a first drain/source region, wherein the second dislocation plane extends in a second direction orthogonal to the first direction.

9. The method of claim 8, further comprising:
forming a first drain/source recess;
depositing a second oxide layer on sidewalls and a bottom of the first drain/source recess;
depositing a second tensile film layer over the second oxide layer; and
applying a second PAI process to the substrate and forming a second PAI region underlying the first drain/source recess as a result of the second PAI process.

10. The method of claim 9, further comprising:
converting the second PAI region into the second dislocation plane using a second anneal process.

11. The method of claim 9, further comprising:
forming a first drain/source region in the first drain/source recess;
forming a second drain/source region in a second drain/source recess; and
forming a gate structure wrapping a channel region around three sides.

12. The method of claim 11, wherein:
the first drain/source region, the second drain/source region and the gate structure form an n-type fin field-effect-transistor.

13. The method of claim 8, further comprising:
forming a third fin over the substrate, wherein the third fin and the second fin are separated by a second isolation region; and
forming a third dislocation plane underlying the second isolation region.

14. The method of claim 13, wherein:
the first dislocation plane and the third dislocation plane are parallel to each other.

15. A method comprising:
forming a first fin and a second fin over a substrate, wherein the first fin and the second fin are separated by a trench;
applying a first pre-amorphous implantation (PAI) process to the substrate and forming a first PAI region underlying the trench as a result of the first PAI process;
depositing a first tensile film layer on sidewalls and a bottom of the trench;
converting the first PAI region into a first dislocation plane underlying the trench using a first anneal process; and
forming an isolation region over the first dislocation plane.

16. The method of claim 15, further comprising:
removing a portion of the first fin to form a drain/source trench;
applying a second PAI process to the substrate and forming a second PAI region underlying the drain/source trench as a result of the second PAI process;
depositing a second tensile film layer on sidewalls and a bottom of the drain/source trench; and
converting the second PAI region into a second dislocation plane underlying the drain/source trench using a second anneal process.

17. The method of claim 16, further comprising:
performing an epitaxial growth process to from a drain/source region in the drain/source trench.

18. The method of claim 16, further comprising:
the second dislocation plane is orthogonal to the first dislocation plane.

19. The method of claim 15, wherein:
the first anneal process is of a temperature in a range from about 500 degrees to about 700 degrees.

20. The method of claim 15, further comprising:
forming an isolation region in the trench.

* * * * *